(12) United States Patent
Kolkman

(10) Patent No.: US 7,486,005 B2
(45) Date of Patent: Feb. 3, 2009

(54) CONNECTOR ARRANGEMENT

(75) Inventor: Manfred Kolkman, Messancy (BE)

(73) Assignee: Delphi Technologies, Inc., Troy, MI (US)

( * ) Notice: Subject to any disclaimer, the term of this patent is extended or adjusted under 35 U.S.C. 154(b) by 738 days.

(21) Appl. No.: 11/126,680

(22) Filed: May 11, 2005

(65) Prior Publication Data

US 2005/0255754 A1 Nov. 17, 2005

(30) Foreign Application Priority Data

May 14, 2004 (EP) .................................. 04252808

(51) Int. Cl.
*H01L 41/08* (2006.01)
(52) U.S. Cl. ....................................................... 310/328
(58) Field of Classification Search ................ 310/328, 310/366, 364, 365; 239/97, 102.2; 439/172, 439/701; 123/291; *H01L 41/08*
See application file for complete search history.

(56) References Cited

U.S. PATENT DOCUMENTS 6,437,489 B1  8/2002  Shinke et al.
6,888,290 B2 *  5/2005  Murai et al. ................. 310/328
7,145,282 B2 * 12/2006  Oakley et al. ............... 310/328
7,288,875 B2 * 10/2007  Kadotani et al. ............ 310/366

FOREIGN PATENT DOCUMENTS

| EP | 0995901 | 4/2000 |
| EP | 1257006 | 11/2002 |
| EP | 1 096 136 | 12/2005 |
| JP | 2000-130285 | 5/2000 |
| JP | 2002-054527 | 2/2002 |
| JP | 054527 | 2/2002 |

* cited by examiner

Primary Examiner—Darren Schuberg
Assistant Examiner—Karen Beth Addison
(74) Attorney, Agent, or Firm—David P. Wood

(57) ABSTRACT

An electrical connector arrangement for a piezoelectric actuator (10) having a stack (26) of one or more piezoelectric elements, the electrical connector arrangement including positive and negative terminals (30, 32) for connection with distribution electrodes (44*a*, 44*b*) of the piezoelectric stack (26). Each of the positive and negative terminals (30, 32) has a lower end face (30*d*, 32*d*) which locates adjacent to an upper end face of the stack (26), in use, and a radially outer contact face (30*e*, 32*e*) for contact with the distribution electrodes (44*a*, 44*b*). The terminals (30, 32) also connect with an external voltage supply, in use. A block (30*c*, 32*c*) of each terminal (30, 32) defines the radially outer contact face (30*e*, 32*e*) for the stack distribution electrodes (44*a*, 44*b*) and thus provides a robust terminal structure.

20 Claims, 5 Drawing Sheets

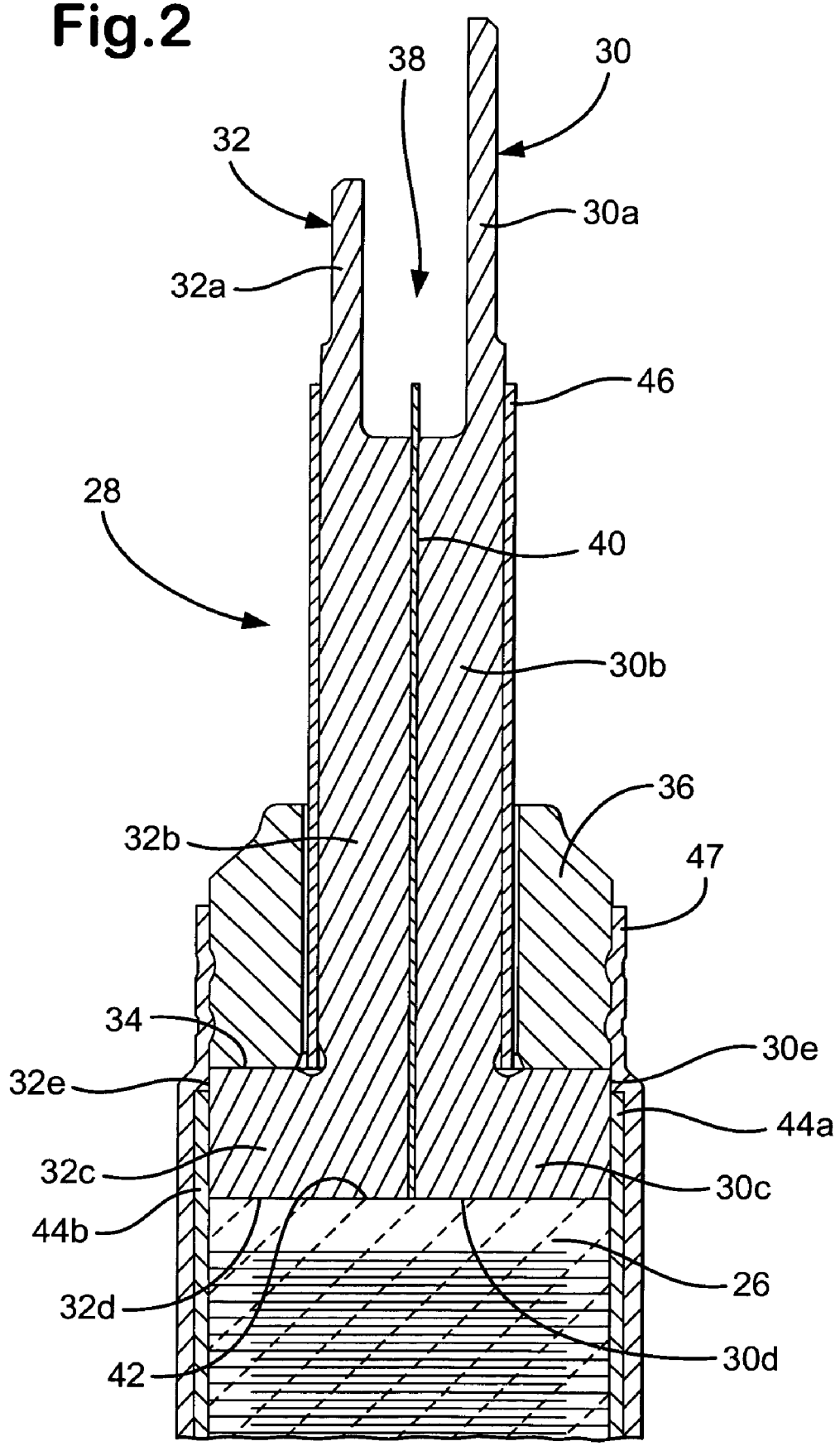

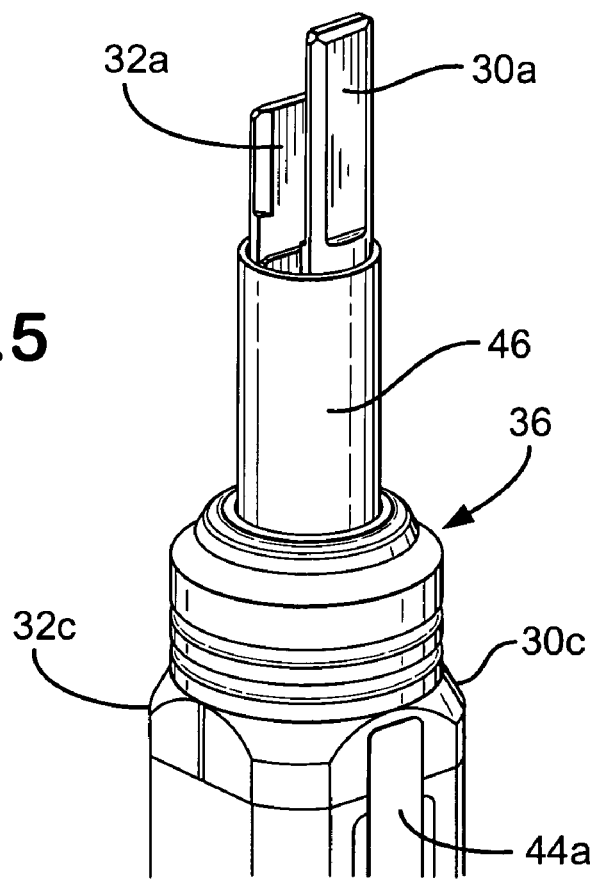
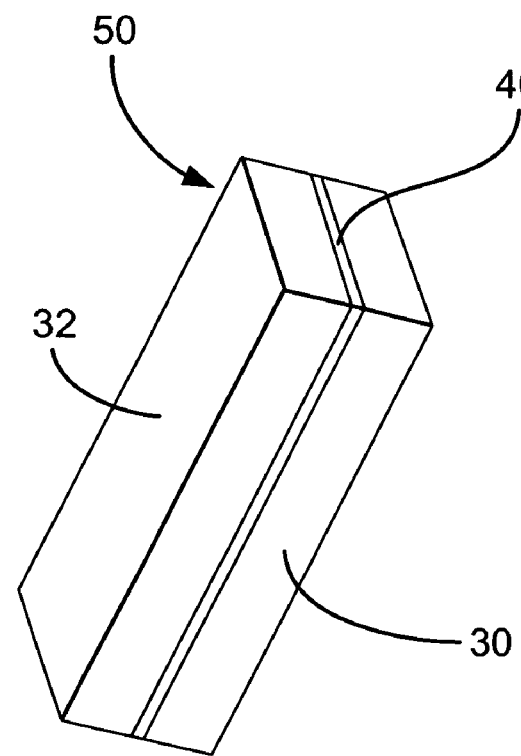

CONNECTOR ARRANGEMENT

BACKGROUND OF THE INVENTION

The present invention relates to an electrical connector arrangement for a piezoelectric actuator and, in particular, to an electrical connector arrangement for a piezoelectric actuator of the type suitable for use in a fuel injector for an internal combustion engine. The invention also relates to an actuator incorporating an electrical connector arrangement and methods of forming an electrical connector arrangement.

DESCRIPTION OF RELATED ART

Fuel injectors for delivering predetermined quantities of fuel into a combustion space of an internal combustion engine, or the like, generally comprise a piston which is actuable to control the pressure of fuel contained within an injector control chamber. The control chamber is defined, in part, by a surface associated with a valve needle such that changes in fuel pressure within the control chamber effect movement of the valve needle, thereby causing fuel to be delivered into the combustion space of the engine.

It is known to provide such fuel injectors with a piezoelectric actuator for controlling movement of the control piston. Such actuators generally consist of a piezoelectric body in the form of a multi-layer laminate or "stack" having layers of piezoelectric or piezoceramic material separated by metal or electrically conductive layers which act as internal electrodes. Positive and negative distribution electrodes are provided on the stack to make contact with the internal electrodes. The distribution electrodes are connected to an external voltage supply, thereby to allow a voltage to be applied across the stack.

The piezoelectric actuator is arranged to convert electrical energy into mechanical or kinetic energy such that the application of an external voltage to the internal electrodes causes the piezoelectric material to expand or contract in dependence upon the magnitude and polarity of the voltage applied. The change in length of the stack which results from this expansion or contraction effects movement of the control piston and, hence, opening and closing of the valve needle.

It is known that the amount of compressive load applied to the piezoelectric stack can significantly influence actuator performance and durability. More specifically, the piezoelectric or piezoceramic material from which the stack is formed is capable of withstanding compressive stress but cannot withstand significant tensile stress. It is therefore advantageous to ensure that a compressive load on the stack is maintained throughout the operating cycle of the injector.

In known piezoelectrically operable fuel injectors used in diesel engines, the piezoelectric stack is often located within a fuel-filled accumulator volume or chamber so that the compressive load applied to the piezoelectric stack is provided by hydrostatic pressure. An actuator of this type is described in our co-pending, published European patent application, EP 0995901 A. Fuel in the accumulator chamber is at high pressure, typically up to 2000 bar, and so hydrostatic loading of the stack is high. The stack is encapsulated within a polymer casing or sleeve which serves to prevent the ingress of fuel into the stack structure.

By way of example, JP2002 054527 describes a known electrical connector arrangement of a piezoelectric actuator for use in a fuel injector. A stack of piezoelectric elements is provided with first and second distribution electrodes and an electrical connector having first and second terminals for applying a voltage to the respective distribution electrodes.

With the stack located within such a high pressure environment, it is a challenge not only to ensure that the electrical connections to the stack are adequately sealed from high pressure fuel within the accumulator volume but also that any associated insulation or sealing of the stack is not affected detrimentally by the high hydrostatic forces.

SUMMARY OF INVENTION

It is an object of the present invention to provide a piezoelectric actuator which addresses the aforementioned concerns and an electrical connector arrangement for use therewith.

According to a first aspect of the invention, there is provided a piezoelectric actuator including a stack of one or more piezoelectric elements, a positive distribution electrode and a negative distribution electrode across which a voltage is applied, in use, and an electrical connector arrangement. The electrical connector arrangement comprises positive and negative terminals for connection with the positive and negative distribution electrodes, respectively, each of the positive and negative terminals having a terminal end face which locates adjacent to an end face of the stack, in use. The piezoelectric actuator is characterised in that each of the positive and negative terminals of the electrical connector arrangement has a radially outer contact face for contact with an inner contact face of a corresponding one of the positive and negative distribution electrodes.

The positive and negative distribution electrodes connect with an external voltage supply, in use, so as to enable a voltage to be applied across the stack to effect changes in stack length. The connector arrangement is particularly beneficial where the actuator is located within an accumulator volume or chamber filled with high pressure fluid (e.g. fuel).

In a preferred embodiment, the terminal end face of each of the positive and negative terminals is defined by a base section of the terminal. Each base section defines the radially outer contact face for contact with a corresponding one of the distribution electrodes. It is a preferred feature that the base section of each of the positive and negative terminals takes the form of a block. Typically, the terminal blocks are arranged so that they locate immediately next to the stack end face. It is convenient to attach the terminal end faces to the stack end face by gluing.

By making the contact with the positive and negative distribution electrodes through a solid, terminal block, rigidity of the connector arrangement is improved. Furthermore, extrusion paths for any sealing material which may be used can be minimised or removed altogether. It is a further advantage that the overall 'envelope' of the terminal assembly is similar to that of the stack, removing geometric transitions between the terminals and the stack and making encapsulation of the stack more convenient.

In a further preferred embodiment, each of the positive and negative terminals includes a terminal stem which extends from its block to terminate in a terminal blade for connection with an external voltage supply, in use.

The terminals, and in particular those regions comprised of the blocks and the stems of the terminals, are preferably spaced apart by an insulator layer, for example an aramid-type paper washer.

It is preferable for the insulator layer to be joined to the positive and negative terminals, one on either side thereof, by means of an adhesive.

In a particularly preferred embodiment, the actuator further comprises an insulating sleeve within which at least a portion of each terminal stem is received. Typically, the insulating sleeve is formed from a heat-shrinkable material. The provision of the sleeve serves to prevent electrical arcing between the terminals and also prevents arcing to the surrounding parts of the assembly (e.g. the body of the injector housing).

In one preferred embodiment, the actuator includes an annular seal which surrounds the insulating sleeve for the terminals. Preferably, the stem and the block of each of the positive and negative terminals define a step therebetween which forms an abutment surface against which the annular seal seats.

Preferably, the annular seal is axi-symmetric in shape and is formed from a ceramic material. It is further preferable for the annular seal to be joined to the abutment surface by means of an adhesive. When employed in a piezoelectrically operable injector of the aforementioned type, the annular seal locates around the insulating sleeve to provide a seal between the accumulator volume and that part of the connector arrangement (i.e. the terminal blades) which connect with the external voltage supply, in use.

In a further preferred embodiment, the annular seal is provided with one or more annular grooves on its outer circumferential surface. The provision of the grooves serves to enhance the seal between the annular seal and any surrounding encapsulation sleeve which is provided on the actuator.

The piezoelectric stack may consist of a plurality of layers of piezoelectric or piezoceramic material, interspersed with a plurality of layers of electrically conductive material which connect with the distribution electrodes. In a preferred embodiment, the layers of piezoelectric or piezoceramic material are each separated by a layer of electrically conductive material which forms a positive and negative electrode pair. The distribution electrodes are preferably provided on outer surfaces of the stack.

According to a second aspect of the invention, there is provided an electrical connector arrangement for use in the piezoelectric actuator as described above.

According to a third aspect of the present invention, there is provided a method of forming an electrical connector arrangement of the second aspect of the invention, the method including the steps of providing a block of electrically conductive material, machining the block to define the positive and negative terminals, each of the terminals having at least a terminal blade and a terminal base, bisecting the block axially so as to separate the positive and negative terminals, and sandwiching an insulator layer between the positive and negative terminals to isolate said terminals from one another electrically.

Preferably, each terminal includes a terminal stem located between the terminal base and the terminal blade.

According to a fourth aspect of the invention, a method of forming an electrical connector arrangement of the second aspect of the invention includes the steps of providing a block of electrically conductive material having a layer of insulator therein, and subsequently machining the block to define the positive and negative terminals which are separated by the insulator layer.

According to a fifth aspect of the invention, a method of forming an actuator of the first aspect of the invention includes (i) affixing the terminal end faces to the stack end face, and (ii) subsequently providing positive and negative distribution electrodes to respective outer faces of the stack so that the positive electrode spans the transition between the stack and the positive terminal and the negative electrode spans the transition between the stack and the negative terminal.

The method may, in one embodiment, include the step of providing a first layer of conductive epoxy to span the positive terminal and a first side of the stack so as to define the positive distribution electrode and providing a second layer of conductive epoxy to span the negative terminal and a second side of the stack so as to define the negative distribution electrode.

This aspect of the invention provides a convenient method of forming the distribution electrodes of the connector arrangement, after the terminals and the stack have been assembled together. Hence, there is no need for fragile distribution electrodes to be contacted with connector terminals at the same time as the connector arrangement and the stack are assembled together. Instead, the distribution electrodes are formed only after the stack and terminals have been brought into contact and fixed (i.e. glued) together.

For the purpose of this specification, references to 'upper' and 'lower' are used for convenience when referring to the orientation of the drawings, but shall not be taken as limiting.

BRIEF DESCRIPTION OF THE DRAWINGS

The present invention will now be described, by way of example only, with reference to the accompanying drawings in which:

FIG. 2 is a section view of an electrical connector arrangement of the present invention, FIG. 5 is a view of the fully assembled electrical connector arrangement (i.e. similar to that shown in FIG. 2) in connection with the piezoelectric actuator, and FIG. 6 is a perspective view of a 'connector block' which may be used in the manufacture of the electrical connector arrangement in FIGS. 2 to 5.

DETAILED DESCRIPTION OF THE INVENTION

Figure 1:
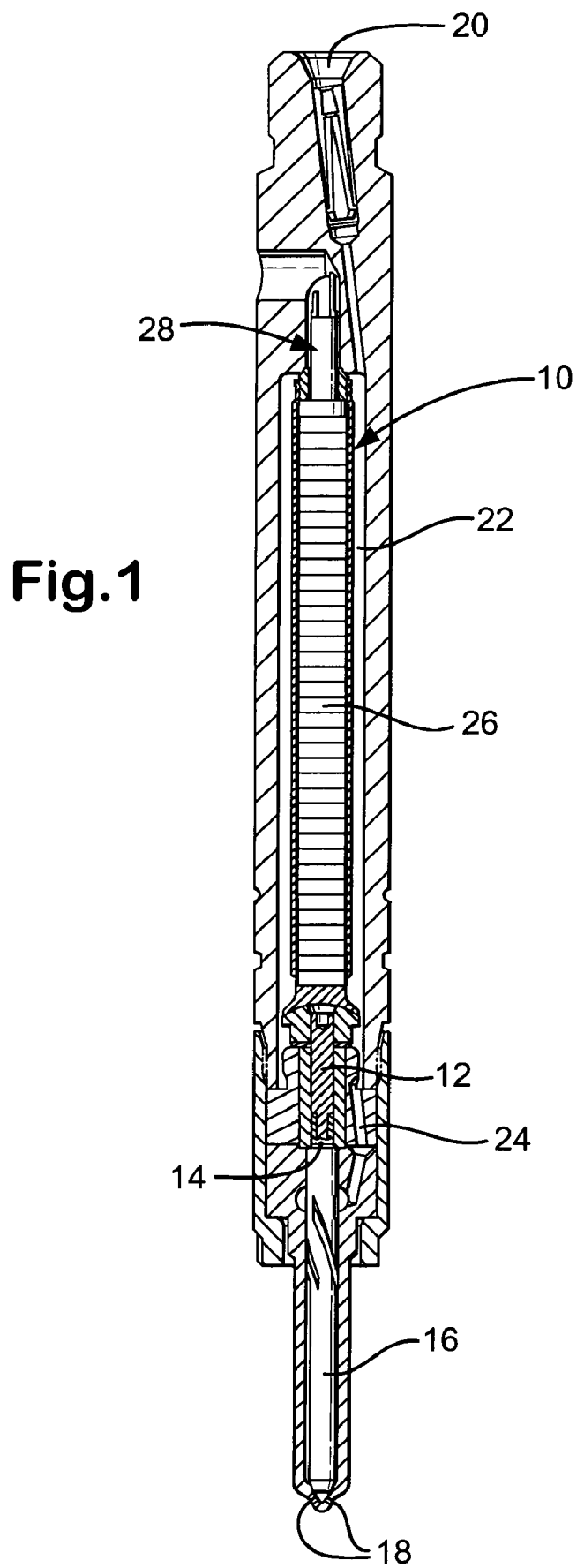
FIG. 1 is a schematic view of a fuel injector of the type having a piezoelectric actuator with which the electrical connector arrangement of the present invention may be used.

Referring to FIG. 1, a piezoelectrically actuated fuel injector for a compression ignition internal combustion engine (diesel engine) includes a piezoelectric actuator, referred to generally as 10, which is arranged to control movement of an injector piston 12. In turn, the piston controls fuel pressure within a control chamber 14 which is arranged at the back of an injector valve needle 16. By controlling fuel pressure within the control chamber 14, an injector valve needle 16 is moved towards and away from a valve needle seating so as to control whether or not injection occurs through one or more injector outlets 18.

High pressure fuel for injection is delivered to an injector inlet 20 located at the upper end of the injector remote from the outlets 18. The inlet 20 supplies fuel, via an accumulator volume 22, to a downstream injector passage 24 and, hence, to the injector outlets 18. The accumulator volume 22 is thus flooded with high pressure fuel, and it is within this volume that a stack 26 of the piezoelectric actuator 10 is located.

The stack 26 comprises a plurality of piezoelectric elements which are separated by internal electrodes (not shown) in a known manner. External electrode means, in the form of positive and negative distribution electrodes (also not shown), are provided on the stack 26 to make appropriate contact with the internal stack electrodes.

An electrical connector 28, or connector module, is arranged at the upper end of the accumulator volume 22 to provide an electrical voltage to the positive and negative distribution electrodes. The connector module 28 includes positive and negative terminals which connect with a respective one of the distribution electrodes to allow an external voltage to be applied to the internal stack electrodes. In the scale of the drawing shown in FIG. 1, the individual terminals of the connector cannot be identified. By controlling the voltage across the stack 26, the length of the stack 26 can be extended and contracted, thereby causing the control piston 12 to be moved to control pressure in the chamber 14.

In order to protect the piezoelectric stack 26 from the surrounding high pressure fuel within the volume 22, the stack 26, including the distribution electrodes, is encapsulated within a polymer casing or sleeve in a known manner. As the piezoelectric stack 26 is located within the fuel-filled volume 22, it is important that the connector module 28 is not only sealed from fuel within the volume but also that the connector module 28, and any necessary sealing parts therefor, can withstand the large hydrostatic forces within the volume 22 with no adverse effect.

The connector module 28 is shown in more detail in FIG. 2, where it can be seen that the module 28 includes a first, positive terminal 30 and a second, negative terminal 32. Each of the positive and negative terminals 30, 32 includes three sections: an upper end section in the form of a terminal blade 30a, 32a which co-operates with an external voltage supply through appropriate connection means (not shown), an enlarged mid-section in the form of a terminal stem or body 30b, 32b, and a lower end section in the form of a base 30c, 32c. The terminal blades 30a, 32a are spaced apart to define a vacant volume 38 therebetween, whereas the stem 30b, 32b of each terminal, and the base 30c, 32c of each terminal, is separated from its neighbour by an insulator member 40. The insulator member takes the form of a layer 40 of insulating material and is sandwiched between the positive and negative terminal stems and base sections, 30b, 32b and 30c, 32c respectively.

The base 30c, 32c of each terminal 30, 32 takes the form of a solid block having a substantially flat, lower end face, 30d, 32d respectively. The terminal end faces 30d, 32d lie flush with one another so as to define a substantially flat contact surface of the terminal assembly 30, 32. The terminal end faces 30d, 32d are located adjacent to, and abut against, a substantially flat, upper end face 42 of the stack 26. The upper face of each terminal block 30c, 32c defines, at its intersection with its associated stem 30b, 32b, a stepped region defining an abutment surface 34.

Positive and negative distribution electrodes 44a, 44b are provided on the stack 26, each of which makes contact with a radially outer contact face 30e, 32e of an associated positive or negative one of the terminal blocks 30c, 32c. To effect contact with the outer contact face 30e, 32e of the block, each of the positive and negative distribution electrodes 44a, 44b has a region which projects beyond the stack end face 42 so that the contact face of each electrode 44a, 44b is on an inner, or inwardly facing, surface thereof.

The stems 30b, 32b of the terminals 30, 32 are received within an insulator sleeve or tube 46. Typically, the sleeve 46 is formed from a heat-shrinkable material. An annular ceramic seal 36 locates over the sleeve 46 to seat against the abutment surface 34 in a sealing manner.

Once the connector module 28 and the piezoelectric stack 26 have been brought into electrical contact in the aforementioned manner, the stack 26 is then encapsulated within an outer sleeve or shield 47 which, when assembled within the injector, protects the elements of the stack 26 from surrounding high pressure fuel within the accumulator volume 22. The manner in which the assembled actuator 10 and connector module 28 may be encapsulated within the outer shield 47 is described in our co-pending International patent application WO 02/061856.

FIG. 3 illustrates more clearly the separate components of the electrical connector and the method by which the connector module 28 may be assembled. FIG. 3(a) shows the negative terminal 32 and FIG. 3(c) shows the positive terminal 30. Both terminals 30, 32 may be identical, although differences in blade chamfering and/or blade length may be provided to ensure incorrect or inverted connection of the connector arrangement is avoided.

Both the stem 30b, 32b and the block 30c, 32c of each terminal 30, 32 are formed from a suitable electrically conductive material, such as phosphor bronze. So as not to prejudice dynamic actuator displacement, the terminal stems 30b, 32b must be as rigid as possible, and so the terminal material is selected with this in mind. The terminal blades 30a, 32a are typically gold or nickel plated.

Figure 3A:
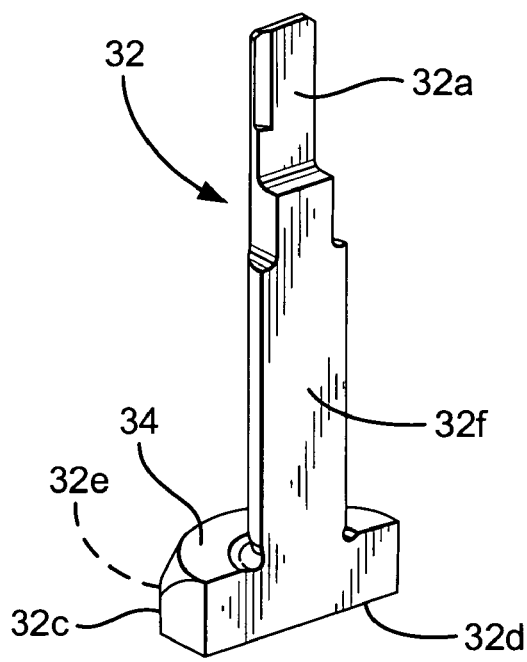
FIGS. 3(a) to (c) show individual parts of the electrical connector arrangement in FIG. 2, prior to assembly thereof.
Figure 3B:
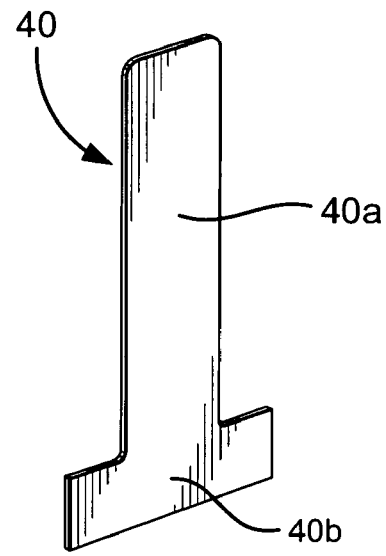
Figure 3C:
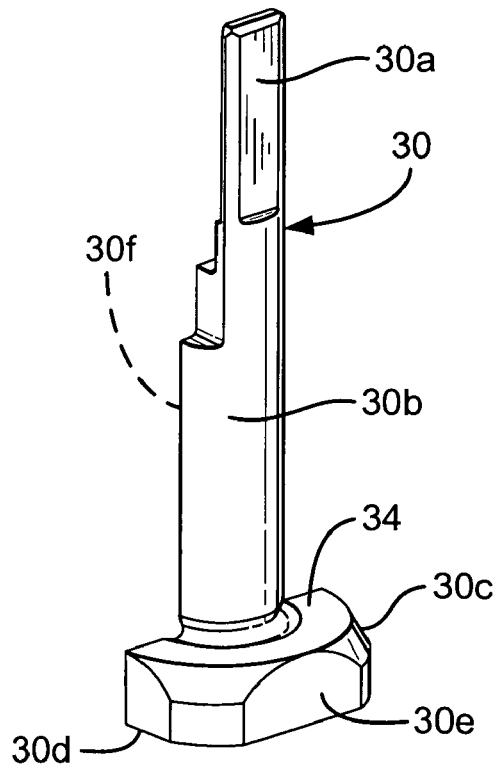
Figure 3D:
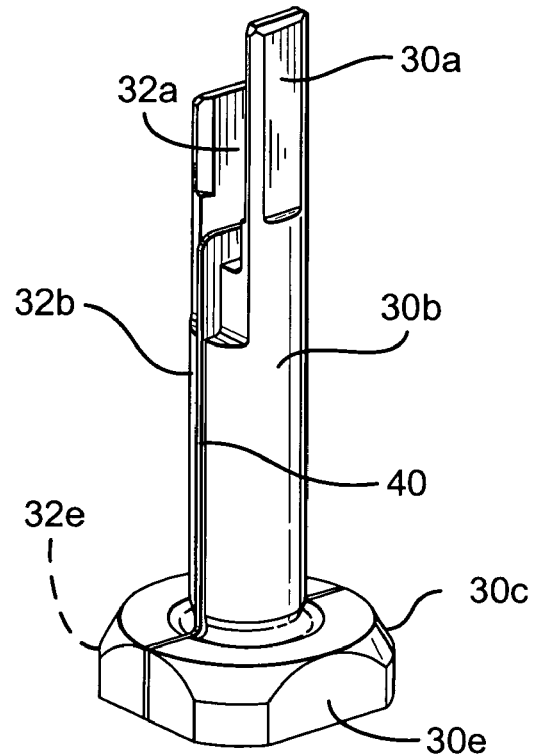
FIG. 3(d) shows a terminal module of the connector arrangement when fully assembled.

FIG. 3(b) shows the insulator layer 40 which locates between the stems 30b, 32b of the positive and negative terminals 30, 32. Typically, the insulator layer 40 may take the form of a T-shaped washer having a stem or body 40a and a cross-piece 40b. The material from which the insulator layer 40 is formed is selected as one having a mechanical modulus of elasticity which is close to that of the material used for the terminals 30, 32. Using a material with this property ensures a substantially homogeneous stress footprint is achieved on the piezoelectric stack 26. This is important as the piezoelectric material from which the stack 26 is formed, being a ceramic, is highly brittle.

Typically, for example, the insulator layer 40 may be formed from paper, such as aramid-type insulating paper. Alternatively, the insulator layer 40 may be formed from a ceramic material, although this will result in an increased layer thickness between the terminals 30, 32.

The profile of the body or stem 40a of the insulator layer 40 is shaped appropriately to match that of the terminal stems 30b, 32b. The cross-piece 40b of the insulator layer 40 is shaped to match that of the terminal blocks 30c, 32c. An inwardly facing (inner) flat surface 30f, 32f of each terminal stem 30b, 32b is coated with adhesive. The terminal stems 30b, 32b are then brought together so as to sandwich the insulator layer 40 therebetween. Subsequently, the adhesive is cured and the terminals 30, 32 are compressed together during the curing process.

After curing of the adhesive, it is important that the end surface 30d, 32d of each terminal block 30c, 32c is ground, or otherwise machined, to remove any trace of cured adhesive. This ensures a substantially flat surface is provided to engage with the stack end face 42. It is also important that any trace of cured adhesive is removed from the stepped abutment surface 34, prior to location of the annular may also adversely affect the axial stiffness of the stack 26.

Once the terminals 30, 32 are assembled together with the insulator layer 40 between them the heat-shrinkable sleeve 46 is located over the adhered parts 30, 32. The provision of the sleeve 46 serves to prevent electrical arcing between the terminals 30, 32 and also prevents arcing to the surrounding injector body (not shown) when the actuator 10 is assembled within the injector. Typically, the heat-shrinkable sleeve 46 is a thin-walled member formed from a fluoropolymer. The sleeve 46 is deformed through the application of heat so that it 'moulds' to fit snugly around the terminals 30, 32. The assembled terminals 30, 32, together with the sleeve 46, are shown in FIG. 5.

Figure 4A:
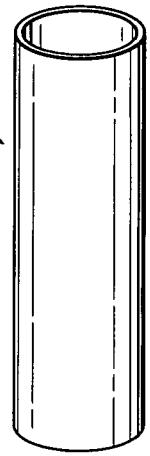
FIGS. 4(a) to (d) illustrate the further assembly stages of the electrical connector arrangement, once the terminal module of FIG. 3(d) has been assembled.
Figure 4B:
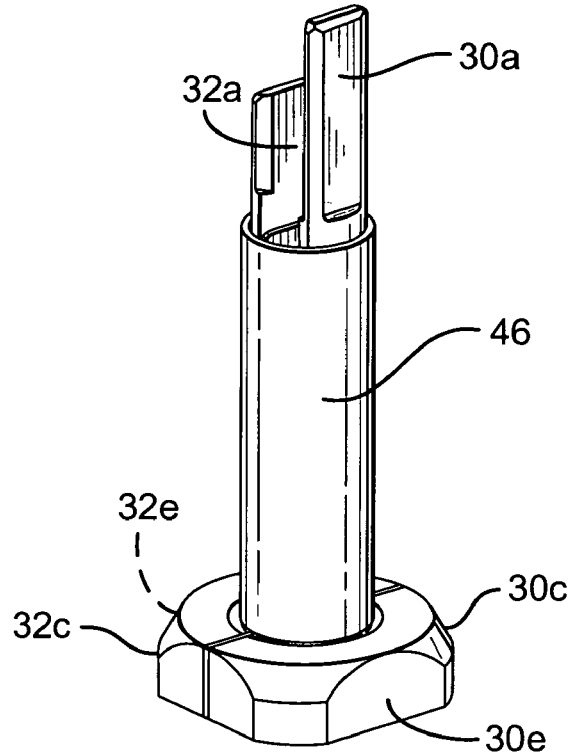
Figure 4C:
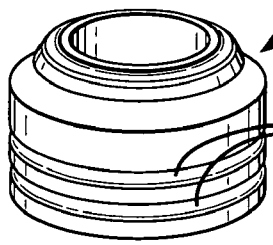
Figure 4D:
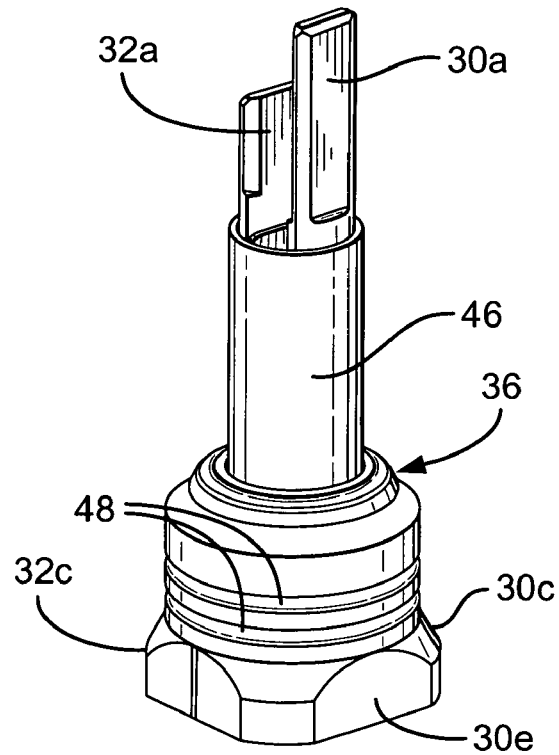

Further adhesive is applied to the abutment surface 34 of the terminal blocks 30d, 32d to fix the annular seal 36 to the surface 34. Typically, the annular seal 36 takes the form of a machineable ceramic and is axi-symmetric in shape (i.e. symmetric about its axis parallel to the stack axis). The axi-symmetric shape of the seal 36 has been found to provide the best sealing properties to the fluoropolymer heat-shrinkable sleeve 46. In addition, internal stresses within the seal 36 are minimised as a result of the symmetric shape. As can be seen in FIGS. 4(c) and (d) in particular, the annular seal 36 is also provided with a plurality of annular grooves or recesses 48 on its outer circumferential surface. The grooves 48 also serve to enhance sealing between the annular seal 36 and the outer encapsulation sleeve 47.

When the connector 28 is fully assembled, it has the appearance shown in FIGS. 2 and 5. When the connector arrangement 28 is mounted upon the stack 26, the first and second distribution electrodes 44a, 44b extend upwardly beyond the stack end face 42 so that their inner surfaces make contact with the outer contact faces 30e, 32e of the terminal blocks 30c, 32c. This differs from previously proposed designs where contact between the connector terminals and the distribution electrodes is at a point along the stack sidewall, with the terminal blades extending over and around the upper surface of the stack and down the stack sides.

It is a particular advantage of the electrical connector arrangement of the present invention, and particularly when the connector is used for an injector actuator of the aforementioned type, that contact between the connector terminals 30, 32 and the distribution electrodes 44a, 44b of the stack 26 is made at the outer contact faces 30e, 32e of the terminal blocks 30c, 32c through co-operation with the inwardly facing surfaces of the stack distribution electrodes 44a, 44b. The contact region experiences a large hydraulic force due to fuel within the volume 22, which serves to benefit the electrical contact. Furthermore, the terminal blocks 30c, 32c provide a much more rigid contact surface for the distribution electrodes than narrow terminal blades. The 'outer envelope' of the terminals 30, 32 is also comparable with that of the stack 26 so that there are no large geometric transitions between the parts and, hence, the outer encapsulation of the stack and terminal assembly 26, 30, 32 can be achieved more easily.

The steps in connecting the terminals 30, 32 to the distribution electrodes 44a, 44b may be completed in one of several sequences. For example, the distribution electrodes 44a, 44b may be first soldered to the stack 26. The terminals 30, 32 are glued to the stack end face 42 and, as a final step, the distribution electrodes 44a, 44b are soldered to the terminals 30, 32. Alternatively, the terminals 30, 32 are first glued to the stack end face 42, and then the distribution electrodes 44a, 44b are soldered to the stack 26 and to the terminals 30, 32 to complete the required electrical connection. In a further alternative method of assembly, the terminals 30, 32 are initially glued to the end face 42 of the stack 26, and then first and second layers of electrical conductive epoxy are painted over the glued parts (30, 32 and 26), spanning the transition between the stack 26 and the terminals 30, 34, to form the positive and negative distribution electrodes 44a, 44b, respectively. As a final step in the assembly sequence, the stack 26 is located within the outer encapsulation sleeve 47, which surrounds the stack 26 in its entirety and extends part way along the length of the annular seal 36 (i.e. as can be seen most clearly in FIG. 2).

The distribution electrodes 44a, 44b may be soldered or otherwise bonded to the stack 26. Once the terminals 30, 32 are brought into contact with the distribution electrodes 44a, 44b, a solder is applied to secure the electrical connection.

When in use, the encapsulated actuator arrangement 10 is located within the fuel-filled accumulator volume 22 of the injector. The upper ends of the terminal blades 30a, 32b are brought into contact with the external supply voltage, via a harness connector, to allow voltage control of the stack 26. Due to the outer encapsulation sleeve and the annular seal 36, the stack elements and regions of electrical contact are protected from high pressure fuel within the volume 22.

One method for forming the connector module 28 is to initially provide a section of stock bar formed from a conductive material (i.e. for the terminals 30, 32) and a separate layer of insulator material (i.e. for the insulator layer 40). The bar is then machined to define the required terminal structure having first and second terminal blades 30a, 32a, first and second terminal stems 30b, 30b and first and second terminal blocks 30c, 32c. The bar is cut along its central axis, or bisected, to separate the positive and negative terminals (as in FIGS. 3(a) and (c)). The insulator layer 40 is then sandwiched between the terminals 30, 32 (as in FIG. 3(d)) followed by the subsequent assembly steps described previously.

An alternative method for constructing the connector module 28 is best illustrated with reference to FIG. 6. The terminal material and the insulating member are initially formed as a rectangular 'block', referred to generally as 50, before the block is machined to form the structure shown in FIG. 3(d). All that is required in this case is to machine the block 50 to form the terminal blades 30a, 32a, the terminal stems 30b, 32b and the base blocks 30c, 32c as the insulator layer 40 is already provided between the terminals 30, 32 within the initial block 50.

The invention claimed is:

1. A piezoelectric actuator for use in a fuel injector, the actuator including:
 a stack of one or more piezoelectric elements;
 a positive distribution electrode and a negative distribution electrode across which a voltage is applied, in use; and
 an electrical connector arrangement comprising positive and negative terminals for connection with the positive and negative distribution electrodes respectively, each of the positive and negative terminals having a terminal end face which locates adjacent to an end face of the stack;
 wherein each of the positive and negative terminals has a radially outer contact face for contact with an inner contact face of a corresponding one of the positive and negative distribution electrodes.

2. The piezoelectric actuator as claimed in claim 1, wherein the terminal end face of each of the positive and negative terminals is defined by a terminal base, and wherein each terminal base defines the outer contact face for contact with a corresponding one of the positive and negative distribution electrodes.

3. The piezoelectric actuator as claimed in claim 2, wherein each terminal base takes the form of a block.

4. The piezoelectric actuator as claimed in claim 3, wherein each of the positive and negative terminals includes a terminal stem extending from its terminal block and terminating in a terminal blade for connection with an external voltage source, in use.

5. The piezoelectric actuator as claimed in claim 4, wherein the terminal stem and the terminal block of each of the positive and negative terminals are spaced apart by an insulator layer.

6. The piezoelectric actuator as claimed in claim 5, wherein the insulator layer is joined to the positive and negative terminals, one of the positive and negative terminals being located on either side of the insulator layer, by means of an adhesive.

7. The piezoelectric actuator as claimed in claim 4, further comprising an insulating sleeve within which at least a portion of each terminal stem is received.

8. The piezoelectric actuator as claimed in claim 5, further comprising an insulating sleeve within which at least a portion of each terminal stem is received.

9. The piezoelectric actuator as claimed in claim 7, wherein the insulating sleeve is formed from a heat-shrinkable material.

10. The piezoelectric actuator as claimed in claim 7, further comprising an annular seal surrounding the insulating sleeve.

11. The piezoelectric actuator as claimed in claim 10, wherein the terminal stem and the terminal block of each of the positive and negative terminals define a step therebetween which defines an abutment surface for the annular seal.

12. The piezoelectric actuator as claimed in claim 11, wherein the annular seal is joined to the abutment surface by means of an adhesive.

13. The piezoelectric actuator as claimed in claim 10, wherein the annular seal is axi-symmetric in shape.

14. The piezoelectric actuator as claimed in claim 10, wherein the annular seal is provided with one or more annular grooves on its circumferential surface.

15. The piezoelectric actuator as claimed in claim 1, further comprising an outer encapsulation means for encapsulating the piezoelectric stack and at least a part of the electrical connector arrangement.

16. An electrical connector arrangement for use in the piezoelectric actuator as claimed in claim 1.

17. A method of forming an electrical connector arrangement as claimed in claim 16, the method including the steps of:
providing a block of electrically conductive material;
machining the block to define the positive and negative terminals, each having at least a terminal blade and a terminal base;
bisecting the block axially so as to separate the positive and negative terminals; and
sandwiching an insulator layer between the positive and negative terminals to isolate said terminals from one another electrically.

18. A method of forming an electrical connector arrangement as claimed in claim 17, the method including:
providing a block of electrically conductive material having an insulator layer therein; and
subsequently machining the block to define the positive and negative terminals which are separated by the insulator layer.

19. A method of forming a piezoelectric actuator as claimed in claim 1, the method including:
(i) affixing the terminal end face of each of the positive and negative terminals to the piezoelectric stack; and
(ii) subsequently providing positive and negative distribution electrodes to respective outer faces of the stack so that the positive electrode spans the transition between the stack and the positive terminal and the negative electrode spans the transition between the stack and the negative terminal.

20. The method as claimed in claim 19, including providing a first layer of conductive epoxy to the positive terminal and a first side of the stack to define the positive distribution electrode and providing a second layer of conductive epoxy to the negative terminal and a second side of the stack to define the negative distribution electrode.

* * * * *